United States Patent

Sanders et al.

[11] Patent Number: 5,663,711
[45] Date of Patent: Sep. 2, 1997

[54] POWER FAILURE ALARM

[75] Inventors: John B. Sanders, Carlsbad; Rejean Laverdiere, San Diego, both of Calif.

[73] Assignee: Aliter Industries, Carlsbad, Calif.

[21] Appl. No.: 474,442

[22] Filed: Jun. 7, 1995

[51] Int. Cl.⁶ ............................................. G08B 21/00
[52] U.S. Cl. .................... 340/635; 340/654; 340/656; 340/663
[58] Field of Search ........................ 340/635, 636, 340/654, 656, 663, 669, 692

[56] References Cited

U.S. PATENT DOCUMENTS

| | | | |
|---|---|---|---|
| 2,740,953 | 4/1956 | Jeppesen | 340/227 |
| 2,782,402 | 2/1957 | Mathisen | 340/213 |
| 3,200,390 | 8/1965 | Eckert, Jr. et al. | 340/248 |
| 3,220,206 | 11/1965 | Armentrout et al. | 62/127 |
| 3,544,986 | 12/1970 | Earling et al. | 340/253 |
| 3,958,212 | 5/1976 | Henthorne | 340/253 |
| 4,003,044 | 1/1977 | Richmond, Jr. | 340/253 |
| 4,065,676 | 12/1977 | Elias | 307/66 |
| 4,097,843 | 6/1978 | Basile | 340/280 |
| 4,155,082 | 5/1979 | Jones et al. | 340/656 |
| 4,169,357 | 10/1979 | Kelley | 62/126 |
| 4,223,307 | 9/1980 | Albritton | 340/656 |
| 4,567,474 | 1/1986 | Wolin et al. | 340/584 |
| 4,618,857 | 10/1986 | Dubois et al. | 340/654 |
| 4,642,616 | 2/1987 | Goodwin | 340/654 |
| 4,725,772 | 2/1988 | Peak | 324/66 |
| 4,816,746 | 3/1989 | Peak | 324/66 |
| 4,972,181 | 11/1990 | Fiene | 340/636 |
| 5,105,182 | 4/1992 | Shindo | 340/654 |
| 5,424,721 | 6/1995 | Asai | 340/636 |

*Primary Examiner*—Jeffery Hofsass
*Assistant Examiner*—Edward Lefkowitz
*Attorney, Agent, or Firm*—Baker, Maxham, Jester & Meador

[57] ABSTRACT

A combination electrical connector and power failure signal device, comprising a generally box-like housing having a front, a back and a chamber, a male electrical plug on the back, a female electrical plug on the front, an electrical circuit in the housing including conductors connecting the male plug to the female plug, an alarm circuit in the housing responsive to power in the electrical circuit maintaining a stand by condition, the alarm circuit including a sensor for sensing a failure of power in the electrical circuit and initiating a first alarm mode, and responsive to a predetermined time in the first alarm mode to terminate the first alarm mode and initiate a second alarm mode, and a battery for powering the alarm circuit during failure of power in the electrical circuit.

16 Claims, 4 Drawing Sheets

POWER FAILURE ALARM

BACKGROUND OF THE INVENTION

The present invention relates to a alarm device and pertains particularly to an improved alarm device for signaling a power failure.

There are many electrical equipment and appliances in the home, businesses and factories which require a continuous supply of electrical power in order to properly function. This includes refrigerators, freezers, computers, clocks, medical and other equipment. Most of these are connected to the main power supply by means of a plug into a wall socket. These may be disconnected in many ways such as unplugging, turning off the power switch to the plug or tripped breaker without it becoming readily apparent. Such power failure can be disastrous in many instances.

Many devices have been proposed in the past to overcome this problem. Most of these devices however, have their own failure problem. For example, they depend on a battery for monitoring and sounding or otherwise signalling an alarm which quickly drains the battery. This often results in a failure of the alarm itself without notice to the user.

Therefore, there is an evident need for a reliable and effective failed power alarm system.

SUMMARY AND OBJECTS OF THE INVENTION

It is the primary object of the present invention to provide a reliable and effective failed power alarm system.

In accordance with the primary aspect of the present invention, a combination electrical connector and power failure signal device, comprises a generally box-like housing having a from, a back and a chamber, a male electrical plug on said back, a female electrical socket on said front, an electrical circuit in said housing including conductors connecting said male plug to said female socket, a monitoring and alarm circuit in said housing responsive to power in said electrical circuit maintaining a stand by condition, said monitoring and alarm circuit including means for sensing a failure of power in said electrical circuit and initiating a first alarm, and means responsive to a predetermined time in said first alarm to terminate said first alarm and initiate a second alarm, and a battery for powering said monitoring and alarm circuit during failure of power in said electrical circuit.

BRIEF DESCRIPTION OF THE DRAWINGS

The above and other objects and advantages of the present invention will become apparent from the following description when read in conjunction with the accompanying drawings wherein.

DETAILED DESCRIPTION OF THE PREFERRED EMBODIMENTS

Figure 1:
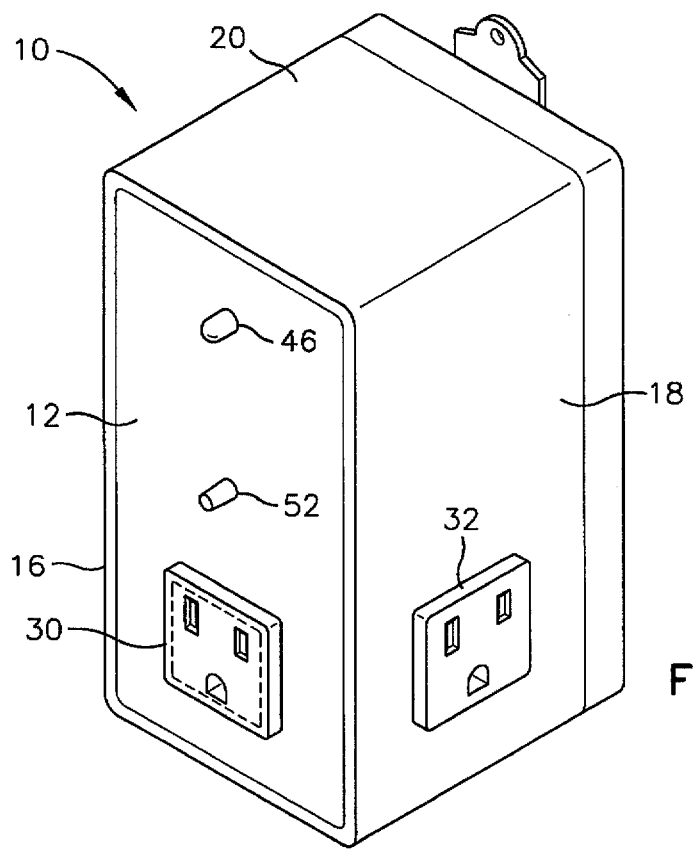
FIG. 1 is a perspective view from the front illustrating a preferred embodiment of the present invention.
Figure 2:
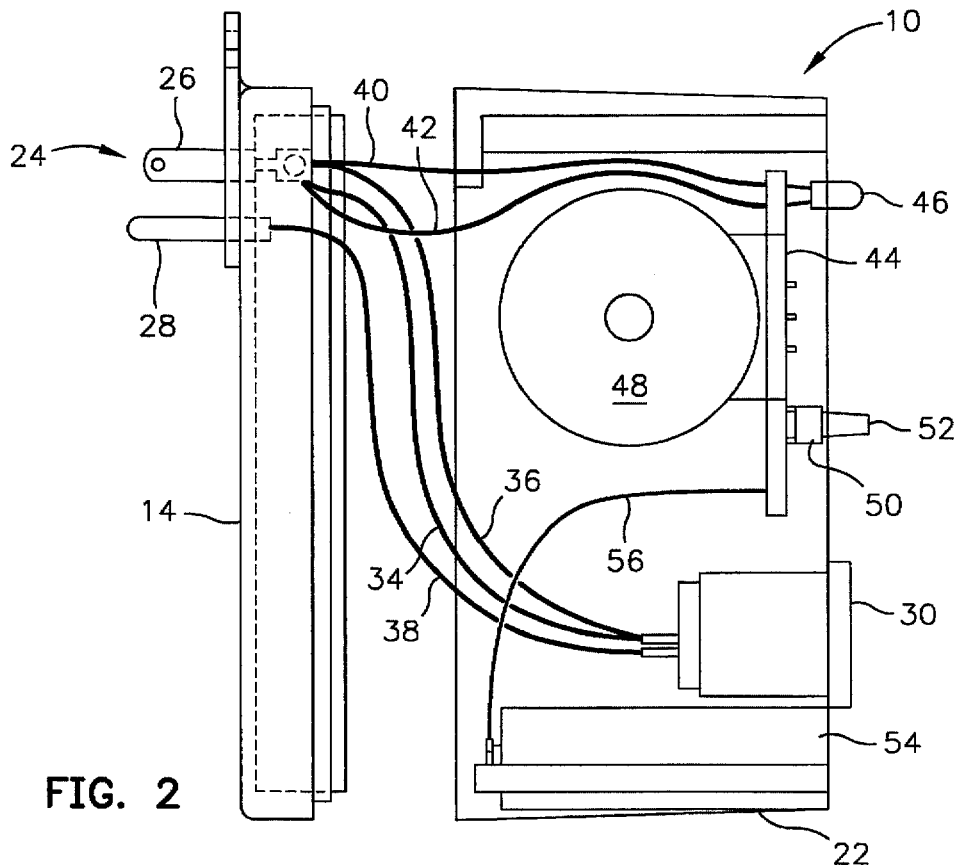
FIG. 2 is a side elevation view partially in section of the embodiment of FIG. 1.

Referring to FIGS. 1 and 2 of the drawing, an exemplary preferred embodiment of the power failure alarm system in accordance with the invention is illustrated and designated generally by the numeral 10. The alarm system is preferably embodied in a housing that plugs into an electrical outlet and also functions as a multiple outlets for multiple appliances. The alarm apparatus comprises a generally rectangular box-like housing having a front wall 12, a back wall 14, side walls 16 and 18 and top and bottom walls 20 and 22 forming a box-like enclosure in which the main components of the system are housed. The housing is preferably constructed of a suitable molded plastic.

The alarm apparatus is provided with the usual electrical plug connector 24, having a pair of electrical prongs, only one of which 26 is shown and a ground prong 28. These prongs 26 of the plug 24 are adapted to connect into the usual wall mounted electrical outlet receptacle or socket. The plug 24 is mounted on the backwall 14 of the housing which, in the illustrated embodiment, functions as a removable cover of the housing to expose the interior chamber thereof.

The housing is also preferably equipped with a plurality of electrical outlet receptacles, two of which are shown at 30 and 32, which are connected by an electrical circuit to the connector plug 24. The electrical circuit includes a pair of conductors 34 and 36 connecting the electrical prongs of the plug 24 to the electrical contacts of the receptacles 30 and 32 on the front and side of the housing. A conductor 38 connects the ground prong 28 of the plug 24 to the ground sockets of the connector receptacles 30 and 32. A pair of conductors 40 and 42 connect the electrical prongs 26 to a printed circuit board 44 which contains the main components of the monitoring and alarm system.

A light emitting diode 46 is mounted on the PC board and is exposed at the front of the housing to indicate or provide a visual indication of the presence of AC power. When AC power is present, the diode 46 is lighted. A piezo electric transducer 48 is also mounted on the circuit board and connected to the monitoring and alarm circuit for providing an audible alarm when AC power fails, as will be explained. The circuit board also includes a reset switch 50 connected into the alarm circuit and actuated or reset by a reset button 52 projecting from the front of the housing.

The monitoring and alarm circuit is normally powered by the AC through an AC to DC converter from the plug 24. However, a backup battery, such as a 9 volt battery 54, is mounted in the housing and connected by suitable conductor 56 to the PC board to supply power to the monitoring and alarm circuit when AC power is not present.

Figure 3:
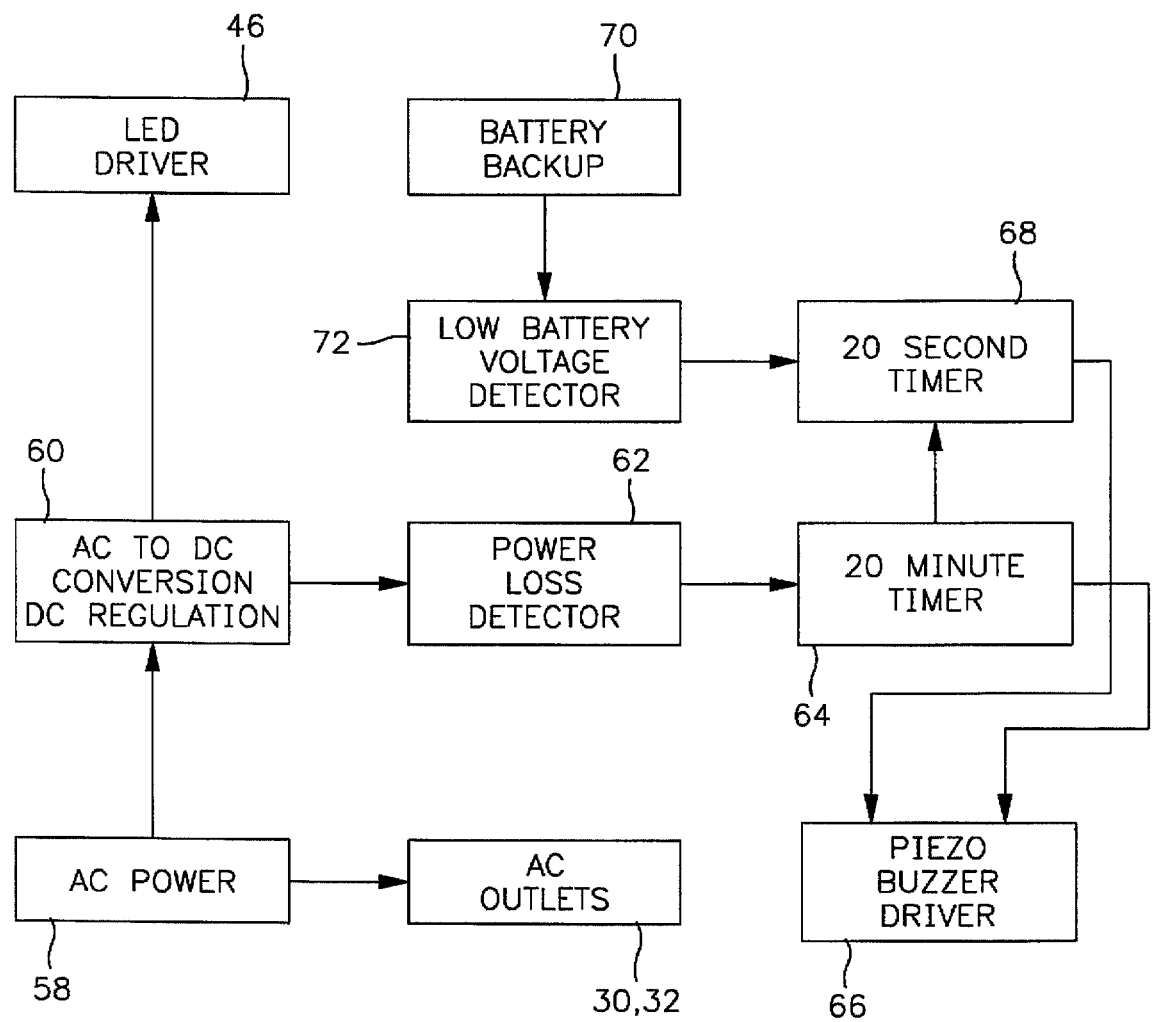
FIG. 3 is a functional block diagram of the embodiment of FIG. 1.

Referring to FIG. 3 of the drawings, a functional block diagram of the system is illustrated. As illustrated in FIG. 3, the system is connected into and monitors a source of AC power 58 and directs the AC power directly from the AC power source to the AC outlets 30 and 32 of the system. Power from the AC circuit is also directed to an AC to DC conversion and DC regulation system 60 which converts AC power to DC power at about 9 or 10 volts for normally powering the monitoring system. Power from the AC to DC converter is then fed to LED 46 to provide a visual signal or indication that AC power is present in the system.

A power loss detector 62 also receives power from the AC to DC conversion unit and monitors the system for the presence or absence of AC power. This power loss detector circuit reacts to a lack of AC power to trigger a Piezo electric driver circuit for driving an alarm through a twenty minute circuit timer 64 causing the driver circuit 66 to generate an audible alarm. The timer circuit 64 controls the alarm or buzzer for a period of twenty minutes and then terminates. A second timer 68 is then activated and continues to drive the buzzer circuit at intermittent intervals for the life of the battery unless terminated by reset or AC power. In the preferred embodiment this intermittent interval is a twenty second interval in which a chirping alarm is signaled. The audible alarm circuit is powered by a 9 volt battery 70 which is monitored by a Low Battery Voltage Detector 72. When a low voltage of less than 7.8 volts in the battery is detected, an alarm is signalled and continues until the battery is replaced.

The battery powers the audible alarm in the absence of the AC power source. The system is designed with the two timers to maximize the chance that the loss of power is detected. The system activates the audible alarm continuously for a period of twenty minutes upon initial loss of power and thereafter at twenty second intervals during the remaining life of the battery. Under the usual circumstances the battery will last for a period of approximately one week.

Other sequences of alarm are possible, depending upon the circumstances. It can also be constructed to meet the demands of particular applications of the monitor. For example, the twenty second monitor is selected as a most likely interval to bring the power failure to the attention of a homeowner, wherein the power alarm is attached to monitor a deep freezer, for example. If, for example, the deep freezer is located in a utility room or garage, it is estimated that a twenty second interval would be slightly less than the time necessary for a homeowner to enter and remove selected items from the freezer and depart.

Both the duration of the initial alarm and the intervals of the power saving intermittent alarm can be altered to meet the circumstances. The longer the duration between the intermittent signals the greater the battery life.

When AC power is reestablished, the alarm is immediately cancelled regardless of the mode, whether normal or power saving. The alarm circuit may also be reset or turned off by the reset switch 52 on the front of the unit.

A battery voltage detector and monitor 72 monitors the battery voltage level during the no alarm. If the battery voltage falls below a preset voltage, such as for example 7.8 volts, the alarm will enter the "power saving" alarm and remain in that until the installation of a fresh cell. Thus, the system monitors itself to insure its operability in case of power failure.

Figure 4B:
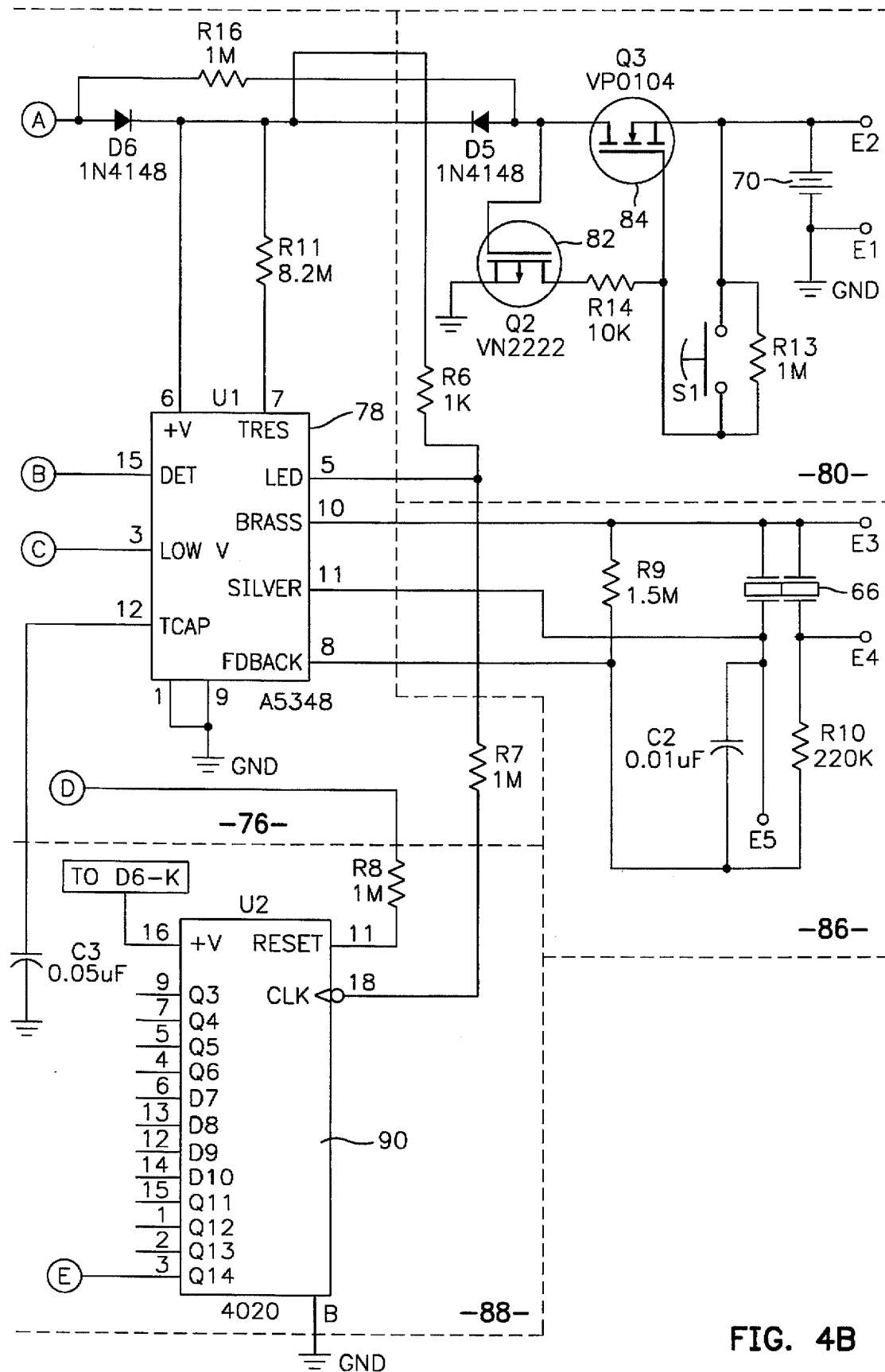
FIG. 4 is a schematic circuit diagram of the preferred embodiment.
Figure 4A:
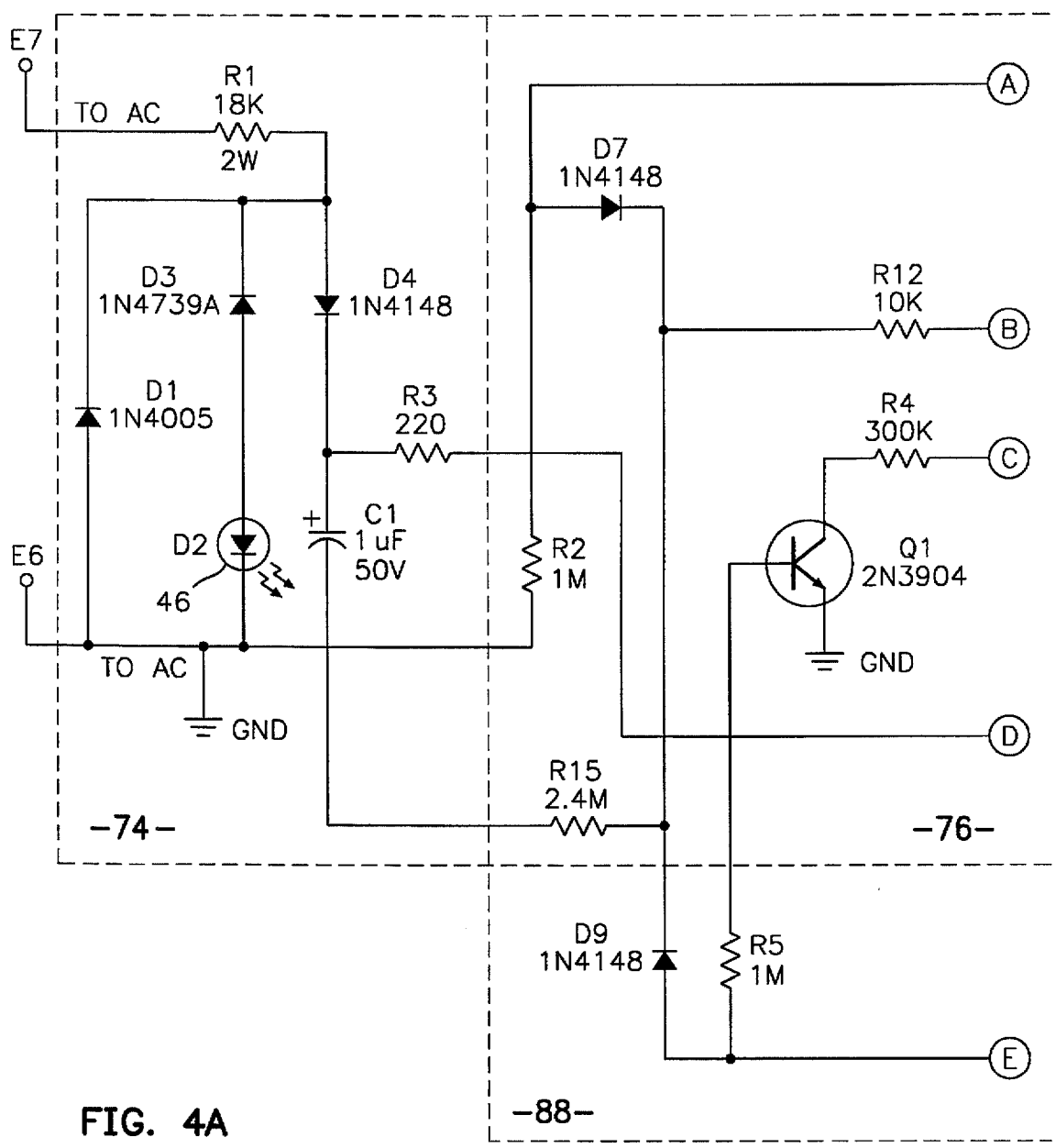

Referring now to FIG. 4, a detailed schematic of an exemplary embodiment of the entire system circuit is illustrated showing specific details of the circuit elements. These circuit elements are connected in a fashion to provide the functional system, as described above. These will be briefly described as it is not felt necessary to describe the elements and their functions in detail.

An AC to DC converter/regulator circuit 74 converts the high voltage AC from the wall outlet to a regulated DC voltage of about 9–10 volts. The circuit also includes the LED 46 that indicates the presence of AC power in the circuit. A circuit 76 contains or functions as a DC detector and Piezo electric driver.

An AC circuit 78 and its associated circuitry detect the presence of DC power and enable signals to the Piezo electric buzzer driver 66 if no DC current is detected. This circuitry also generates a master clock used to time the internal operation of the detector. It also includes a back-up battery test circuit that verifies at appropriate intervals, such as twenty seconds, the state of the disposable backup battery 70. An audible warning is triggered if the backup battery fails or falls to a predetermined level. The section of the circuit designated 80 functions as a power switch enabling the power to the overall circuit. The two Mosfit transistors 82 and 84 form a low-leakage latch that is enabled by the AC/DC converter. The reset switch 52 is also functional to reset the latch and turn off the power to the circuit. A circuit section designated 86 functions to tune the oscillator to the natural frequency of the buzzer to maximize the output and efficiency of the buzzer.

A counter sequence circuit 88 has a counter divider 90 which uses the clock generated by the DC detector of section 76 to trigger the overall circuit into two different alarms of operation. The counter is normally held at reset during normal operations. When the alarm is triggered, the counter will allow approximately twenty minutes of operation of the continuous alarm 1. The counter then will force the circuit into a second or "power saving" alarm, 2, which consists of a chirp every twenty seconds. This alarm will continue until battery depletion or a return of AC power, whichever should occur first. This alarm can also be terminated by reset switch.

Thus, it will be seen from the above description that we have provided an improved power fail alarm system which monitors AC power in a circuit and initiates an alarm upon failure of the power. The system initiates a first-alarm alarm upon initial power failure for a first-predetermined time and thereafter initiates a power saving alarm which saves power of the backup battery during a second alarm operation for the life of the backup battery. The system also monitors and provides a warning for a failure of the backup battery.

While we have illustrated and described our invention by means of specific embodiments, it is to be understood that numerous changes and modifications may be made therein without departing from the spirit and the scope of the invention as defined in the appended claims.

We claim:

1. A combination electrical connector and power failure signal device, comprising:
    a generally box-like housing having a front, a back and a chamber;
    a male electrical plug on said back;
    a female electrical socket on said front;
    an electrical circuit in said housing including conductors connecting said male plug to said female socket;
    a monitoring and alarm circuit in said housing responsive to power in said electrical circuit maintaining a stand by condition, said monitoring and alarm circuit including means for sensing a failure of power in said electrical circuit and initiating a continuous audible first alarm and means responsive to a predetermined time in said first alarm to terminate said first alarm and initiate an intermittent audible second alarm and
    a battery for powering said monitoring and alarm circuit during failure of power in said electrical circuit.

2. A signal device according to claim 1 wherein said alarm circuit returns to said stand by condition upon restoring power to said power circuit.

3. A signal device according to claim 2 wherein said first alarm has a twenty minute duration.

4. A signal device according to claim 3 wherein said second alarm has a twenty second interval.

5. A signal device according to claim 3 further comprising an indicator light on an exterior portion of said housing responsive to indicate a source of electrical power.

6. A signal device according to claim 1 further comprising an indicator light on an exterior portion of said housing responsive to indicate a source of electrical power.

7. A combination electrical connector and power failure signal device, comprising:

a generally box-like housing having a front wall, a back wall and opposing side walls defining a chamber;

a male electrical plug on said back wall for plugging into a wall receptacle;

a female electrical plug on at least one of said side walls and front wall;

an electrical power circuit in said housing including conductors connecting said male plug to said female plug;

a combination monitoring and alarm circuit in said housing for monitoring said electrical power circuit and providing a signal indicative of the condition of the power circuit, said alarm circuit including means responsive to power in said electrical circuit for activating a visual indicator and maintaining a stand by condition, said alarm circuit including means responsive to a failure of power in said electrical circuit for initiating a continuous first alarm of a predetermined duration, and means responsive to a predetermined time in said first alarm to terminate said first alarm and initiate a second alarm defined by intermittent audible alarms of short duration at predetermined intervals; and a battery for powering said alarm circuit during failure of power in said electrical circuit.

8. A signal device according to claim 7, wherein said predetermined duration is about twenty minutes.

9. A signal device according to claim 8 wherein said short duration is about 0.2 seconds and said predetermined intervals are about twenty second.

10. A signal device according to claim 8 wherein said alarm circuit includes a visible indication of power in said power circuit.

11. A signal device according to claim 10 wherein said alarm circuit returns to said stand by condition upon restoring power to said power circuit.

12. A combination electrical connector and power failure signal device, comprising:

a generally box-like housing having a front wall, two side walls, a back wall and a chamber;

a male electrical plug on said back wall for connection to a wall socket;

a female electrical plug on at least said front wall for connecting an electrical appliance;

an electrical power circuit in said housing including conductors connecting said male plug to said female plug;

an alarm circuit in said housing responsive to power in said electrical circuit for maintaining a stand by condition, said alarm circuit including means for sensing a failure of power in said electrical circuit for initiating a continuous audible first alarm of about a twenty minute duration, and means responsive to said twenty minute duration in said first alarm to terminate said first alarm and initiate a second alarm defined by intermittent audible alarms of about 0.2 seconds duration at about twenty second intervals; and a battery for powering said alarm circuit during failure of power in said electrical circuit.

13. A signal device according to claim 12 wherein said alarm circuit includes a visible indication of power in said power circuit.

14. A signal device according to claim 13 wherein said alarm circuit returns to said stand by condition upon restoring power to said power circuit.

15. A signal device according to claim 14 wherein said alarm circuit derives power from said power circuit during said standby condition.

16. A signal device according to claim 12 further comprising an indicator light on an exterior portion of said housing responsive to indicate a source of electrical power in said power circuit.

* * * * *